United States Patent [19]

Durham

[11] Patent Number: 4,948,697
[45] Date of Patent: Aug. 14, 1990

[54] POSITIVE PHOTORESIST WITH A SOLVENT MIXTURE OF PROPYLENE GLYCOL ALKYL ETHER AND PROPYLENE GLYCOL ALKYL ETHER ACETATE

[75] Inventor: Dana Durham, Bloomsbury, N.J.

[73] Assignee: Hoechst Celanese Corporation, Somerville, N.J.

[21] Appl. No.: 376,147

[22] Filed: Jul. 5, 1989

Related U.S. Application Data

[63] Continuation of Ser. No. 97,252, Sep. 17, 1987, abandoned, which is a continuation of Ser. No. 791,880, Oct. 28, 1985, abandoned.

[51] Int. Cl.$^5$ .................. G03C 1/60; G03C 1/76
[52] U.S. Cl. ...................... 430/165; 430/166; 430/169; 430/191; 430/192; 430/193
[58] Field of Search ............... 430/191, 192, 193, 169, 430/165, 166

[56] References Cited

U.S. PATENT DOCUMENTS

| | | | |
|---|---|---|---|
| 3,228,768 | 1/1966 | Straw et al. | 96/49 |
| 3,666,473 | 5/1972 | Colom et al. | 430/192 |
| 3,859,099 | 1/1975 | Petropoulos et al. | 430/190 |
| 3,868,254 | 2/1975 | Wemmers | 96/75 |
| 3,869,292 | 3/1975 | Peters | 96/115 R |
| 3,882,038 | 5/1975 | Clayton et al. | 252/164 |
| 3,933,517 | 1/1976 | Vivian | 252/171 |
| 4,308,368 | 12/1981 | Kubo et al. | 430/192 |
| 4,351,895 | 9/1982 | Walls | 430/331 |
| 4,355,094 | 10/1982 | Pampalone et al. | 430/296 |
| 4,381,340 | 4/1983 | Walls | 430/331 |
| 4,397,937 | 8/1983 | Cleeck et al. | 430/192 |
| 4,409,317 | 10/1983 | Shiraishi | 430/270 |
| 4,411,983 | 10/1983 | Washizawa et al. | 430/325 |
| 4,416,976 | 11/1983 | Schell | 430/309 |
| 4,439,516 | 3/1984 | Cerrigliaro et al. | 430/192 |
| 4,460,674 | 7/1984 | Uehara et al. | 430/192 |
| 4,482,661 | 11/1984 | Liu | 524/906 |
| 4,550,069 | 10/1985 | Pampalone | 430/165 |
| 4,552,908 | 11/1985 | Nicks et al. | 523/504 |
| 4,592,787 | 6/1986 | Johnson | 134/38 |
| 4,764,450 | 8/1988 | Ruckert et al. | 430/192 |

OTHER PUBLICATIONS

Hamlin, J. E., "New Propylene Glycol Ethers and Acetates", Paint & Resin, 10/1983.
Chemical Abstracts-vol. 89:107342c.
Chemical Abstracts-vol. 94:832681.
Chemical Abstracts, vol. 94:44370d.

Primary Examiner—Charles L. Bowers, Jr.
Attorney, Agent, or Firm—Richard S. Roberts

[57] ABSTRACT

The invention provides a positive working photosensitive element with improved odor and increased photospeed which comprises coating a formulation containing at least one novolak or polyvinyl phenol resin, at least one o-quinone diazide and a solvent mixture comprising propylene glycol alkyl ether and propylene glycol alkyl ether acetate, onto a substrate, drying, exposing to imaging energy and developing.

13 Claims, No Drawings

POSITIVE PHOTORESIST WITH A SOLVENT MIXTURE OF PROPYLENE GLYCOL ALKYL ETHER AND PROPYLENE GLYCOL ALKYL ETHER ACETATE

This application is a continuation of aplication Ser. No. 07/097,252, filed Sep. 17, 1989, abandoned, which was a continuation of Ser. No. 06/791,880 filed Oct. 25, 1985, abandoned.

BACKGROUND OF THE INVENTION

The present invention relates generally to radiation sensitive positive photoresist compositions and particularly to compositions containing novolak resins together with naphthoquinone diazide sensitizing agents.

It is well known in the art to produce positive photoresist formulations such as those described in U.S. Pat. Nos. 3,666,473, 4,115,128 and 4,173,470. These include alkali-soluble phenol-formaldehyde novolak resins together with light-sensitive materials, usually a substituted naphthoquinone diazide compound. The resins and sensitizers are dissolved in an organic solvent or mixture of solvents and are applied as a thin film or coating to a substrate suitable for the particular application desired.

The novolak resin component of these photoresist formulations is soluble in alkaline aqueous solution, but the naphthoquinone sensitizer acts as a dissolution rate inhibitor with respect to the resin. Upon exposure of selected areas of the coated substrate to actinic radiation, however, the sensitizer undergoes a radiation induced structural transformation and the exposed areas of the coating are rendered more soluble than the unexposed areas. This difference in solubility rates causes the exposed areas of the photoresist coating to be dissolved when the substrate is immersed in alkaline developing solution while the unexposed areas are largely unaffected, thus producing a positive relief pattern on the substrate.

In most instances, the exposed and developed substrate will be subject to treatment by a substrate-etchant solution or gas plasma. The photoresist coating protects the coated areas of the substrate from the etchant and thus the etchant is only able to etch the uncoated areas of the substrate, which, in the case of a positive photoresist, correspond to the areas that were exposed to actinic radiation. Thus, an etched pattern can be created on the substrate which corresponds to the pattern of the mask, stencil, template, etc., that was used to create selective exposure patterns on the coated substrate prior to development.

The relief pattern of photoresist on substrate produced by the method described above is useful for various applications including, for example, as an exposure mask or a pattern such as is employed in the manufacture of miniaturized integrated electronic components.

The properties of a photoresist composition which are important in commercial practice include the photospeed of the resist, development contrast, resist resolution, and resist adhesion.

Increased photospeed is important for a photoresist, particularly in applications where a number of exposures are needed, for example, in generating multiple patterns by a repeated process, or where light of reduced intensity is employed such as, in projection exposure techniques where the light is passed through a series of lenses and mono-chromatic filters. Thus, increased photospeed is particularly important for a resist composition employed in processes where a number of multiple exposures must be made to produce a mask or series of circuit patterns on a substrate. These optimum conditions include a constant development temperature and time in a particular development mode, and a developer system selected to provide complete development of exposed resist areas while maintaining a maximum unexposed resist film thickness loss not exceeding about 10 percent of initial thickness.

Development contrast refers to a comparison between the percentage of film loss in the exposed area of development with the percentage of film loss on the unexposed area. Ordinarily, development of an exposed resist coated substrate is continued until the coating on the exposed area is substantially completely dissolved away and thus, development contrast can be determined simply by measuring the percentage of the film coating loss in the unexposed areas when the exposed coating areas are removed entirely.

Resist resolution refers to the capability of a resist system to reproduce the smallest equally spaced line pairs and intervening spaces of a mask which is utilized during exposure with a high degree of image edge acuity in the developed exposed spaces.

In many industrial applications, particularly in the manufacture of miniaturized electronic components, a photoresist is required to provide a high degree of resolution for very small line and space widths (on the order of one micron or less).

The ability of a resist to reproduce very small dimensions, on the order of a micron or less, is extremely important in the production of large scale integrated circuits on silicon chips and similar components. Circuit density on such a chip can only be increased, assuming photolithography techniques are utilized, by increasing the resolution capabilities of the resist. Although negative photoresists, wherein the exposed areas of resist coating become insoluble and the unexposed areas are dissolved away by the developer, have been extensively used for this purpose by the semiconductor industry, positive photoresists have inherently higher resolution and are utilized as replacements for the negative resists.

A problem with the use of conventional positive photoresists in the production of miniaturized integrated circuit components is that the positive resists generally have slower photospeed than the negative resists.

Various attempts have been made in the prior art to improve the photospeed of positive photoresist compositions. For example, in the U.S. Pat. No. 3,666,473, a mixture of two phenolformaldehyde novolak resins was utilized together with a typical sensitizer, said novolak resins being defined by their solubility rates in alkaline solutions of a particular pH and by their cloud points. In United States Patent No. 4,115,128, a third component consisting of an organic acid cyclic anhydride was added to the phenolic resin and naphthoquinone diazide sensitizer to provide increased photospeed.

The present invention provides a process for producing an improved positive working photoresist which demonstrates improved odor while retaining or improving the resist photospeed, erosion rate, plasma etch rate, and contrast. It has been unexpectedly found that such an improved resist can be formulated when the novolak or polyvinyl phenol resin and quinone diazide photosensitizer are blended with a solvent component comprising a mixture of propylene glycol alkyl ether acetate and propylene glycol alkyl ether. This component also acts as a solvent for the resin and photosensitizer to facilitate the application of the resist to a substrate. This component demonstrates lower toxicity over other solvents useful for forming photoresists.

A positive working photoresist comprising propylene glycol alkyl ether acetate is described in U.S. patent application Ser. No. 619,468 filed June 11, 1984, as well as U.S. patent application Ser. No. 791,252, filed on Oct. 25, 1985, and which are incorporated herein by reference.

A positive working photosensitive composition comprising a mono $C_1$ to $C_4$ alkyl glycol ether of 1,2 propanediol is described in U.S. Pat. No. 742,063 filed June 6, 1985 and is incorporated herein by reference.

Photosensitive compositions containing only one of propylene glycol alkyl ether and propylene glycol alkyl ether acetate have a disadvantage. Propylene glycol monomethyl ether acetate (PGMEA) has an offensive odor to approximately one-half the people who came in contact with it. These are usually women. Propylene glycol monomethyl ether (PGME) is also offensive to approximately one-half the people who are exposed to it. These are usually men. However, those who find PGMEA offensive find PGME to have little or no odor. The reverse is also true, those who object to PGME find PGMEA to be pleasant or not objectionable. Mixtures of these solvents i.e. PGME/PGMEA (1:1) are not objectionable, or at least less objectionable to both groups of individuals. Based on these observations resists using PGME/PGMEA mixtures form a class of reduced odor photoresists.

SUMMARY OF THE INVENTION

The invention provides a photoresist composition and a method for producing a photoresist which comprises forming a composition containing at least one resin selected from the group consisting of novolaks and polyvinyl phenols, and at least one o-quinone diazide photosensitizer, and a solvent composition, which solvent composition comprises a mixture of propylene glycol alkyl ether and propylene glycol alkyl ether acetate; coating said composition on a substrate, drying said composition such that it is substantially non-tacky but contains residual solvent in an amount of from about 1% to about 30% based on the dried coating weight; imagewise exposing the composition to imaging energies and removing the exposed areas with an aqueous alkaline developer.

The invention also provides photosensitive positive working composition suitable for use as a photoresist, which comprises at least one resin selected from the group consisting of novolaks and polyvinyl phenols, at least one o-quinone diazide photosensitizer and a sufficient amount of a solvent composition which comprises propylene glycol alkyl ether and propylene glycol alkyl ether acetate to form a homogeneous solution.

In the preferred embodiment the invention uses a positive working photosensitive composition which comprises a novolak resin, a quinone diazide photosensitizer and a sufficient amount of a mixture of propylene glycol alkyl ether and propylene glycol alkyl ether acetate. Most preferably the acetate is propylene glycol methyl ether acetate. The most preferred ether is propylene glycol methyl ether. Both the ether and acetate preferably contain $C_1$ to $C_4$ alkyl units.

The photoresist of the present invention, in addition to exhibiting excellent photospeed in comparison with prior art positive photoresists, exhibits a high degree of resolution and good development contrast and adhesion properties. These properties are in marked contrast to some prior art resins which achieve moderately increased photospeed while at the same time sacrificing resolution and contrast. The composition also demonstrates improved composition odor.

DETAILED DESCRIPTION OF THE PREFERRED EMBODIMENT

As hereinbefore mentioned, the invention provides a composition containing a novolak or polyvinyl phenol resin, a quinone diazide photosensitizer and a solvent composition comprising a mixture of propylene glycol alkyl ether and propylene glycol alkyl ether acetate.

The production of novolak resins, which may be used for preparing photosensitive compositions, is well known in the art. A procedure for their manufacture is described in *Chemistry and Application of Phenolic Resins*, Knop A. and Scheib, W.; Springer Verlag, New York, 1979 in Chapter 4 which is incorporated herein by reference. Polyvinyl phenols are described in U.S. Pat. No. 3,869,292 and U.S. Pat. No. 4,439,516, which are incorporated herein by reference. Similarly, the use of o-quinone diazides is well known to the skilled artisan as demonstrated by *Light Sensitive Systems*, Kosar, J.; John Wiley & Sons, New York, 1965 in Chapter 7.4 which is also incorporated herein by reference. These sensitizers which comprise a component of the process of the present invention are selected from the group of substituted naphthoquinone diazide sensitizers which are conventionally used in the art in positive photoresist formulations. Such sensitizing compounds are disclosed, for example, in U.S. Letters Pat. Nos. 2,797,213; 3,106,465; 3,148,983; 3,130,047; 3,201,329; 3,785,825; and 3,802,885. Useful photosensitizers include naphthoquinone-(1,2)-diazide-5-sulfonyl chloride, and naphthoquinone-(1,2)-diazide-4-sulfonyl chloride condensed with phenolic compounds such as hydroxy benzophenones.

In the preferred embodiment, the solid parts of the photoresist composition, that is the resin and diazide preferably ranges from 15% to about 99% resin and from about 1% to about 85% quinone diazide. A more preferred range of resin would be from about 50% to about 90% and most preferably from about 65% to about 85% by weight of the solid resist parts. A more preferred range of the diazide would be from about 10% to about 50% and more preferably from about 15% to about 35% by weight of the solid resist parts. In manufacturing the resist composition the resin and diazide are mixed with a solvent composition comprising a mixture of propylene glycol alkyl ether and propylene glycol alkyl ether acetate such that the solvent composition is present in an amount of from about 40% to about 90% by weight of the overall resist composition. A more preferred range is from about 60% to about 83% and most preferably from about 65% to about 70% by weight of the overall resist composition. In the preferred embodiment the ratio of PGME to PGMEA can vary in a broad range depending on the desires of the user. One suitable range of such ratios is from about 1:20–20:1. A preferred range is from about 10:1–1:10, more preferably about 6:4–4:6. In the most preferred embodiment the PGME and PGMEA are present in approximately a 1:1 ratio.

Additives such as colorants, dyes, anti-striation agents, plasticizers, adhesion promoters, speed enhancers, solvents and such surfactants as non-ionic surfactants may be added to the solution of resin, sensitizer and solvent composition before the solution is coated onto a substrate.

Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) at one to ten percent weight levels, based on the combined weight of resin and sensitizer. The dye additives help provide increased resolution by inhibiting back scattering of light off the substrate.

Anti-striation agents may be used up to five percent weight level, based on the combined weight of resin and sensitizer.

Plasticizers which may be used include, for example, phosphoric acid tri-$\beta$-chloroethyl)-ester; stearic acid; dicamphor; polypropylene; acetal resins; phenoxy resins; and alkyl resins at one to ten percent weight levels, based on the combined weight of resin and sensitizer. The plasticizer additives improved the coating properties of the material and enable the application of a film that is smooth and of uniform thickness to the substrate.

Adhesion promoters which may be used include, for example, $\beta$-(3,4-epoxy-cyclohexyl)-ethyltrimethoxysilane; p-methyl-disilanemethyl methacrylate; vinyltrichlorosilane; and $\gamma$-aminopropyl triethoxysilane up to a 4 percent weight level, based on the combined weight of resin and sensitizer.

Speed enhancers that may be used include, for example, picric acid, nicotinic acid or nitrocinnamic acid at a weight level of up to 20 percent, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhancers will also cause a larger loss of photoresist coating from the unexposed areas.

Solvents may include xylene, butyl acetate and Cellosolve ® acetate and may be present in the overall composition in an amount of up to 95% by weight although preferably no additional solvents are employed in the composition.

Non-ionic surfactants that may be used include, for example, nonylphenoxy poly(ethyleneoxy) ethanol; octylphenoxy (ethyleneoxy) ethanol; and dinonyl phenoxy poly(ethyleneoxy) ethanol at up to 10 percent weight levels, based on the combined weight of resin and sensitizer.

The prepared resist solution, can be applied to a substrate by any conventional method used in the photoresist art, including dipping, spraying, whirling and spin coating. When spin coating, for example, the resist solution can be adjusted as to the percentage of solids content in order to provide coating of the desired thickness given the type of spinning equipment utilized and the amount of time allowed for the spinning process. Suitable substrates include silicon, aluminum or polymeric resins, silicon dioxide, doped silicon dioxide, silicon nitride, tantalum, copper, polysilicon, ceramics and aluminum/copper mixtures.

The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters.

After the resist composition solution is coated onto the substrate, the substrate is temperature treated at approximately 20° to 105° C. This temperature treatment is selected in order to reduce and control the concentration of residual solvents in the photoresist through evaporation while not causing substantial thermal degradation of the photosensitizer. In general one desires to minimize the concentration of solvents and thus this temperature treatment is conducted until a substantial amount of the solvents has evaporated and a thin coating of photoresist composition, on the order of a micron in thickness, remains on the substrate. This treatment is normally conducted at temperatures in the range of from about 20° C to about 105° C. In a preferred embodiment the temperature is conducted at from about 50° C to about 105° C. A more preferred range is from about 80° C to about 105° C. This treatment is conducted until the rate of change of solvent removal becomes relatively insignificant. The temperature and time selection depends on the resist properties desired by the user as well as equipment used and commercially desired coating times. Commercially acceptable treatment times for hot plate treatment are those up to about 3 minutes, more preferably up to about 1 minute. In one example, a 30 second treatment at 90° is useful. In a convection oven, evaporation may take from 15 minutes to one hour or more. The coating is rendered non-tacky and it is within the contemplation of this invention that the dried coating contains residual solvent in an amount of from about 1–30%, preferably 5–20% and more preferably 8–12% based on the weight of the dried coating. The coated substrate can then be exposed to actinic radiation especially ultraviolet radiation in any desired exposure pattern, produced by use of suitable masks, negatives, stencils, templates, etc., in a manner well known to the skilled artisan.

The exposed resist-coated substrates are next substantially immersed in an aqueous alkaline developing solution. The solution is preferably agitated, for example, by nitrogen burst agitation. Suitable developers non-exclusively include water solutions containing an alkali hydroxide, ammonium hydroxide or tetramethyl ammonium hydroxide. However, any other suitable developer known to the skilled artisan may be employed. The substrates are allowed to remain in the developer until all, or substantially all, of the resist coating has dissolved from the exposed areas.

After removal of the coated wafers from the developing solution, a post-development heat treatment or bake may be employed to increase the coating's adhesion and chemical resistance to etching solutions and other substances. The post-development heat treatment can comprise the oven baking of the coating and substrate below the coating's softening point. This post exposure baking or heat treatment may be conducted at from about 95° C to about 160° C, preferably 95° C to 150° C, more preferably 112° C to 120° C. This heating treatment may be conducted with a hot plate system for from about 10 seconds to the time necessary to crosslink the resin. This normally ranges from about 10 seconds to 90 seconds, more preferably from about 30 seconds to about 90 seconds and most preferably from 15 to 45 seconds. Durations for longer than 90 seconds are possible but do not generally provide any additional benefit. Longer times are required for convection oven baking. The time selected depends on the choice of composition components and the substrate used. In industrial applications, particularly in the manufacture of microcircuitry units on silicon/silicon dioxide-type substrates, the developed substrates may be treated with a buffered, hydrofluoric acid base etching solution or gas plasma. The resist compositions of the present invention are resistant to acid-base etching solutions and gas plasma etching and provide effective protection for the unexposed resist-coating areas of the substrate.

The following specific examples will provide detailed illustrations of the present invention. These examples are not intended, however, to limit or restrict the scope of the invention in any way and should not be construed as providing conditions, parameters or values which must be utilized exclusively in order to practice the present invention.

EXAMPLES

Resist formulations are prepared as follows:
23.8% Binder Resin
7.0% Photoactive Compound
69.2% Solvent Composition The binder resin is a cresol-formaldehyde novolak.

The photoactive compound is the condensation product of 2,1-diazonapthoquinone-5-sulfonyl chloride and 1,2,3-trihydroxybenzophenone.

The solvent comprises mixtures of PGME/PGMEA as shown in Table I.

Resist absorptivities are 1.33 ±0.03 l/g cm in all cases.

The resists are spin-coated to give a film thickness of 2.0 um after a 90° C/30 min. softbake by adjusting the spin speed and are measured on a Rudolph Film Thickness Monitor. Photospeed and contrast numbers are generated via laser interferometry and are the result of a linear regression treatment of 8 data points. Development in all cases is by use of a 1:1 water dilution of AZ Photoresist Developer available commercially from American Hoechst Corporation, Somerville, NJ. From these examples one can conclude that mixtures of PGME/PGMEA produce less objectionable odor photoresists while Photospeed and contrast data are comparable to single solvent (PGMEA) resists.

sists of a mixture of propylene glycol alkyl ether and propylene glycol alkyl ether acetate to form a homogenous solution wherein said resin is present in the composition in sufficient quantity amount to act as a binder for a photoresist, and wherein said diazide is present in sufficient quantity amount to act as an effective photosensitizer for a photoresist, and wherein said ether and said acetate are present in said composition in a ratio by weight of from about 1:20 to about 20:1.

2. The composition of claim 1 wherein said acetate component is propylene glycol methyl ether acetate.

3. The composition of claim 1 further comprising one or more additives selected from the group consisting of colorants, anti-striation agents, plasticizers, adhesion promoters, speed enhancers, solvents and surfactants.

4. The composition of claim 1 wherein said resin is present in an amount of from about 5% to about 40% based on the weight of said composition.

5. The composition of claim 1 wherein said diazide is present in an amount of from about 5% to about 35% based on the weight of the solids portion of the composition.

6. The composition of claim 1 wherein said diazide component comprises one or more compounds selected from the group consisting of diazo sulfonyl-chloride reaction products with hydroxy or polyhydroxy aryl compounds, aryl amines or polyamines.

7. A photosensitive element which comprises a substrate and the dried composition of the homogenous solution of claim 1 disposed on said substrate, wherein the dried composition contains residual solvent in an amount of from 1% to about 30% as based on the dried coating weight of the composition.

8. The element of claim 7 wherein said substrate comprises one or more components selected from the group consisting of silicon, aluminum, polymeric resins, silicon dioxide, doped silicon dioxide, silicon nitride, tantalum, copper, polysilicon, ceramics and aluminum/copper mixtures.

9. The composition of claim 1 wherein said photosensitizer is the condensation product of naphthoquinone-(1,2)-diazide(2)5-sulfonyl chloride with trihydroxybenzophenone.

10. The composition of claim 1 wherein said resin is a novolak.

11. The composition of claim 1 wherein said resin is a cresol-formaldehyde novolak.

TABLE I

| | SOLVENT PGME:PGMEA | RESIN | FILM THICKNESS (um) (SPIN SPEED, RPM) | CONTRAST | % CHANGE IN PHOTOSPEED PS (1)% |
|---|---|---|---|---|---|
| A. | 9:1 | Novolak | 2.073 (6K) | 3.5 | +3.9 |
| | 9:1 | Novolak | 2.073 (6K) | 3.5 | −3.0 |
| B. | 1:1 | Novolak | 2.067 (5K) | 3.5 | +1.3 |
| | 1:1 | Novolak | 2.095 (5K) | 3.5 | −4.5 |
| C. | 1:9 | Novolak | 1.999 (4.25K) | 2.9 | +8.2 |
| | 1:9 | Novolak | 2.062 (4.25K) | 2.9 | +1.5 |
| D. | 0:1 | Novolak | 2.055 (3.75K) | 3.7 | — |

(1) PGMEA Solvent resist used as a reference.

$$PS = \frac{PS\ sample - PS\ ref.}{PS\ ref.} \times 100\%$$

What is claimed is:

1. A photosensitive positive working composition suitable for use as a photoresist, which comprises, at least one resin selected from the group consisting of novolaks and polyvinyl phenols, at least one o-quinone diazide photosensitizer and a sufficient amount of a solvent composition which solvent composition con- 12. The composition of claim 1 wherein said ether is propylene glycol methyl ether.

13. The composition of claim 1 wherein said ether and said acetate are present in a ratio of from about 1:10–10:1.

* * * * *